United States Patent [19]

Carver

[11] 4,445,095

[45] Apr. 24, 1984

[54] AUDIO AMPLIFIER

[76] Inventor: Robert W. Carver, P.O. Box 664, Woodinville, Wash. 98072

[21] Appl. No.: 348,283

[22] Filed: Feb. 12, 1982

Related U.S. Application Data

[63] Continuation of Ser. No. 151,365, May 19, 1980, abandoned.

[51] Int. Cl.³ .......................... H03F 3/04; H02M 7/00
[52] U.S. Cl. ..................................... 330/297; 363/125
[58] Field of Search ...................... 307/252 B, 252 M; 363/86, 125, 120; 330/297

[56] References Cited

U.S. PATENT DOCUMENTS 3,466,527  9/1969  Chun .................................... 363/52

FOREIGN PATENT DOCUMENTS 51-35531  10/1977  Japan .
52-119149 10/1977  Japan .
52-119150 10/1977  Japan .

OTHER PUBLICATIONS

Miura et al. "New Power Supply for Audio Power Amplifiers" IEEE Transaction on Consumer Electronics, vol. CE-24, No. 3, 1978.

*Primary Examiner*—James B. Mullins
*Assistant Examiner*—Gene Wan
*Attorney, Agent, or Firm*—Hughes, Barnard & Cassidy

[57] ABSTRACT

An audio amplifier connected to the secondary winding of a transformer. The primary winding of the transformer is connected in a series with a triac to a conventional power source, such as a 60 hertz, 115 to 120 volt source of alternating current. The triac is turned on at a predetermined time during the latter portion of each half cycle to cause a current pulse to be transmitted through the primary winding. To make the triac non-conductive to terminate each pulse, there is provided a bypass circuit (comprising a second triac and a capacitor in series) connected in parallel with the first triac. A tank circuit is connected in parallel with the transformer primary to cause an oscillation in the primary winding, so that the second triac can be turned on at a time of low current to shunt the first triac, thus causing it to turn off and terminate the current pulse.

29 Claims, 10 Drawing Figures

AUDIO AMPLIFIER

This application is a continuation, of application Ser. No. 151,365, filed May 19, 1980 now abandoned.

BACKGROUND OF THE INVENTION

This invention relates generally to audio amplifiers, and more specifically to means for controlling the power supply for the audio amplifier.

Solid state circuit components have brought incredible reduction in the size, weight and cost of audio amplifier circuitry and have also achieved increased fidelity in sound reproduction as compared with vacuum tube technology of a prior generation. In an attempt to exploit to the limit the potential of solid state circuitry, audio engineers have striven to provide the user with increased power ratings while simultaneously achieving decreased distortion levels. Their efforts have met with resounding success, but have produced some undesirable side effects primarily in the areas of increased weight, cost and power consumption. For example, a commercially available state-of-the-art 400 watt amplifier typically weights anywhere from 16 kg to over 38 kg depending upon the particular design and choice of materials. Such amplifiers normally employ costly components necessitated by the peak loads which they must carry, and generate significant amounts of heat which must be dissipated to avoid component damage.

With regard to the transformer weight problem an obvious approach would be to reduce the number of windings and/or the gauge of the wire making up the transformer coils. However, reduction in the number of windings also reduces the inductance in the primary coil, thereby increasing idling currents through the coil and contributing to both heat generation and increased power consumption. The conventional method for achieving low idling currents in the primary has been to use a large number of windings. This approach also requires a large number of windings in the secondary to keep the voltage in the secondary at the proper level. The other obvious alternative for weight reduction, i.e., reduction in the wire gauge, is not an acceptable solution since the internal resistance of each coil would be increased, leading to excessive heat generation and power loss upon high power demands beings placed on the transformer. Conventional wisdom has thus taught the necessity of increasing the size and weight of the transformer whenever a transformer powered amplifier is redesigned for increased power rating.

An alternative approach for reducing the overall weight, size and cost of audio amplifiers has been to reduce the total input power requirement without decreasing output power capability. Such increases in amplifier efficiency permit the use of less costly, lower weight power supplied, and can be achieved by reducing the power dissipation which normally attends the conventional use of output transistors in the output stage of the amplifier. When such power dissipation decreases are achieved, additional weight and cost savings are realized beyond those realized in the power supply since the weight, size and cost of the heat sinks normally required by the output transistors in the amplifier may also be reduced.

U.S. Pat. No. 3,426,290 to Jensen is representative of one known approach for increasing amplifier efficiency by keeping the voltage supplied to the output transistor of the amplifier very close to the output voltage level, thereby permitting operation of the output transistor in a condition which is at all times only slightly out of saturation. When operated in this condition, the actual voltage drop across the output transistor will be maintained quite low and the power dissipated by the transistor (equal to voltage across the transistor X current through the transistor) will be correspondingly reduced. A rather complex regulator is employed in the Jensen circuit to maintain the desired voltage supply to the output transistor wherein energy is stored in an inductive capacitive circuit by means of a switching transistor operated at high speed in response to a control signal derived from the audio input signal. By operating the switching transistor in full "on" or full "off" condition to maintain the desired voltage supply to the amplifier output transistor, energy consumption by the combined regulator and output transistor is reduced over that which would be consumed by an output transistor operated with a conventional fixed supply voltage. While producing a decided advantage in amplifier efficiency, the Jensen circuit is only truly effective if the switching transistor is operated at high frequencies, which can in turn cause transient interference distortion in the amplifier output signal. U.S. Pat. No. 4,054,843 to Hanada discloses a similar circuit to that disclosed in Jensen.

An alternative approach to achieving improved amplifier efficiency is disclosed in the patent to Dryden, U.S. Pat. No. 3,319,175, which discloses a stepped voltage supply operated in response to the voltage level of the amplifier output whereby the minimum voltage from the available power supply voltages sufficient to achieve the desired amplification is applied across the power amplifying element.

Still another approach disclosed in the prior art is illustrated in U.S. Pat. No. 3,622,899 to Elsenberg. In this patent a lower power dissipation amplifier circuit is disclosed including plural transistors coupled in series to a load terminal wherein the transistors are energized by respective voltage sources having different magnitudes and wherein the transistors are biased to operate as amplifiers in sequence in response to an input signal of increasing magnitude.

The patent to Schade, Jr., U.S. Pat. No. 3,887,898, discloses a transistor series amplifier wherein plural series connected transistors in the output stage are biased to share the total voltage drop in the output stage to permit use of lower cost components.

Still other techniques for reducing the cost of amplifier power supplies have been disclosed in the prior art. For example, in the U.S. patent to Munch, Jr., U.S. Pat. No. 3,542,952, a technique is disclosed wherein a single power supply may serve two Class B amplifier circuits designed to amplify the same audio signal by phase inverting the input to one amplifier to cause the amplifiers to draw peak current from the power supply in alternation.

None of the prior art systems discussed above addresses directly the problem of reducing power supply weight and costs by modifying the supply itself in a manner to employ less costly lighter, weight components while maintaining the power supply capabilities required by the amplifier circuit.

The patent to Chun, U.S. Pat. No. 3,466,527, discloses a circuit for reducing the cost and size of a transformer based voltage supply circuit including a duty cycle controlled switch in the A.C. power supply circuit of the transformer primary. The switch functions to regulate output voltage from the secondary. However, this patent does not in any way suggest how such a circuit design could be employed in an audio amplifier circuit in a manner to obtain power supply weight and cost reductions.

With regard to regulating power to the primary of a transformer, U.S. Pat. No. 4,051,425, Smith, shows a switching device comprising a triac connected in series with the primary winding of a transformer. There is a commutation circuit consisting of a second triac and a capacitor connected in series with one another across the first triac. Subsequent to the first triac being turned on to initiate a current pulse through the primary winding of the transformer, the second triac is fired to cause the charge on the capacitor to appear across the first triac and overcome the current then flowing through the first triac to turn it off. The capacitor thereafter continues to discharge and because of the inductance in the primary coil of the transformer and a second inductor, current continues to flow in the same direction through the second triac and cause the charge on the capacitor to become reversed so that it is able to stop the current through the first triac during the next half-cycle when the second triac is again fixed. Experimental work by the applicant herein indicates that when high current is passing through the first triac, the capacitor must be made quite large to overcome the current and shut the triac off.

A search of the prior art has disclosed the following additional U.S. patents, and also a number of Japanese patents. These are as follows: U.S. Pat. No. 3,470,444, Bixby; U.S. Pat. No. 3,723,849, Ludlott; U.S. Pat. No. 3,506,905, Thomas; U.S. Pat. No. 4,115,742, Yokoyama; Japanese Pat. No. 50-141743; Japanese Pat. No. 49-58451; Japanese No. 50-455550.

In view of the foregoing, it is an object of the present invention to provide for an audio amplifying apparatus or the like, an improved apparatus and method for controlling the current pulses delivered to the primary winding of the transformer which supplies power for the amplifier or the like.

More specifically, it is an object of the present invention to provide an effective circuit by which the current pulse to the primary can be both turned on and turned off effectively with relatively simple and inexpensive circuit components.

Other objects will become apparent from the following detailed description.

SUMMARY OF THE INVENTION

The amplifying apparatus of the present invention comprises power input terminal means adapted to be connected to a source of current. There is a transformer with primary and secondary windings, said primary winding being connected to the power input means. First switch means are interconnected with the primary winding and the power input terminal means to cause current pulses from the power input terminal means to the primary winding.

Connected in parallel with the first swtich means is circuit bypass means, the circuit bypass means comprising second switch means and capacitor means connected in series with one another. Further, an oscillating circuit means is operatively connected to the first switch means to cause an oscillation in current pulses flowing through the first swtich means. The amplifying means is operatively connected to the secondary winding of the transformer so as to draw current therefrom.

Control means is operatively connected to the first and second switch means in a manner to cause the first switch means to become conductive at successive periods of time to initiate successive current pulses through the first switch means and through the primary winding. The control means subsequently causes the second switch means to be conductive at time of lower current magnitude of oscillation in the current pulses to cause current through the primary winding to flow through the current bypass means and to cause the first switch means to be non-conductive. The control means operates in a manner that the first switch means becomes conductive in a manner to provide lower pulses for lower power requirements of the amplifying means, and becomes conductive in a manner to provide higher power pulses for higher power requirements of the amplifying means.

Desirably the first switch means comprises a triac which conducts pulses of alternating current through the primary winding. Also, in the preferred form the second switch means comprises a second triac which bypasses current through the primary winding for both negative and positive pulses of alternating current.

In the preferred form, the oscillating circuit comprises a tank circuit connected across the first switch means. Specifically, the oscillating circuit means comprises an inductance coil means and a capacitor means connected in series with one another and across the first switch means and the primary winding. Further, there is coil inductance means connected at one end between the coil means and the capacitor means of the circuit bypass means, and by another end is connected to the power input terminal means.

In the method of the present invention, there is provided power input terminal means adapted to be connected to a source of current and a transformer with primary and secondary windings. The first switch means that is interconnected with the primary winding and the power input terminal means is caused to become conductive at periodic time intervals to initiate current pulses from the power input terminal means to the primary winding.

The method further comprises causing an oscillation in at least latter portions of the current pulses. The circuit bypass means is caused to be conductive at a time of lower current magnitude of oscillation in the current pulses to cause current through the primary winding to flow through the current bypass means, and also to cause the first switch means to be non-conductive. Then current through the bypass means is blocked to stop current flow through the primary winding so as to terminate each current pulse.

The conductivity of the first switch means and the circuit bypass means is controlled in a manner to provide lower power pulses for lower power requirements and to provide higher power pulses for higher power requirements.

Other features of the invention will become apparent from the following detailed description.

DESCRIPTION OF THE PREFERRED EMBODIMENT

Figure 1:
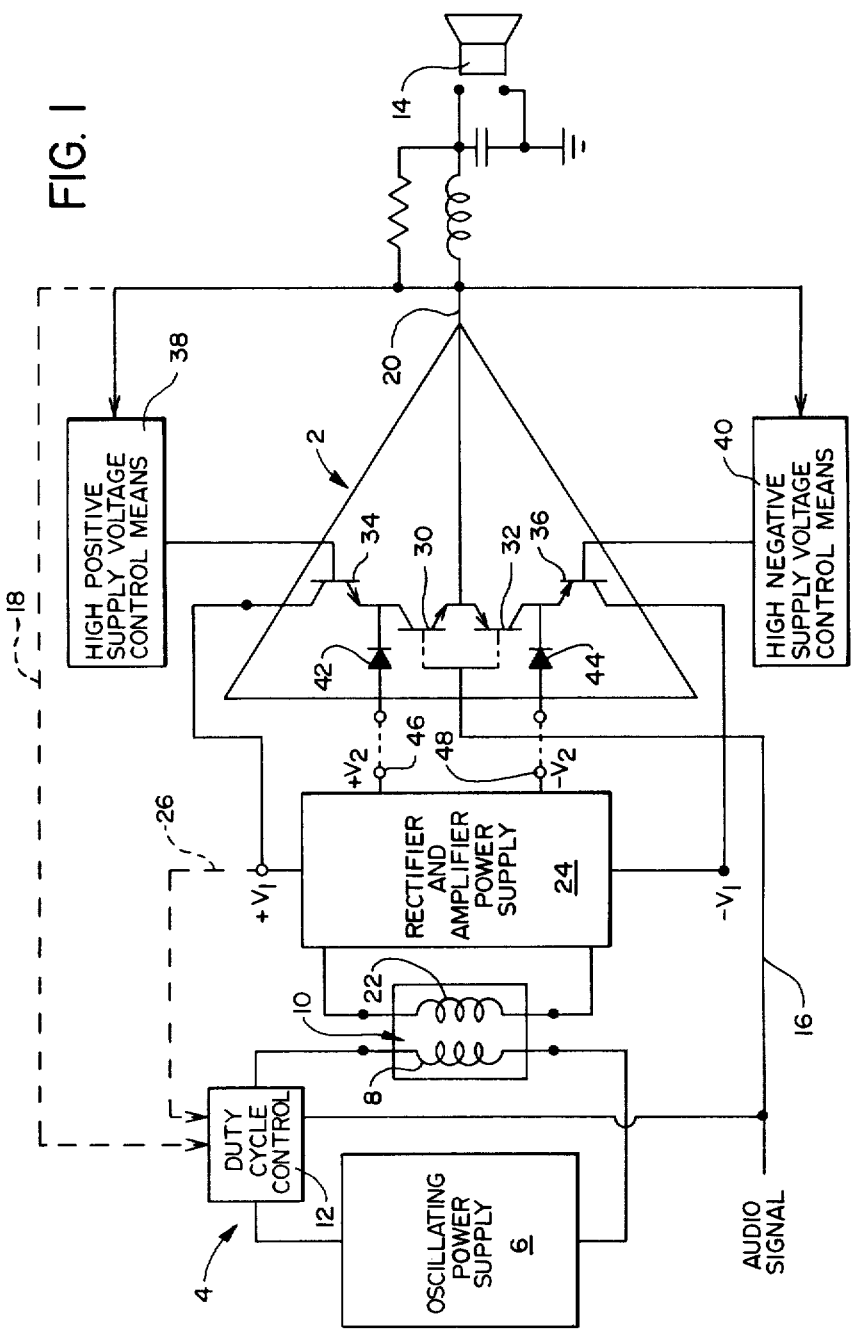
FIG. 1 is a highly schematic drawing of an audio amplifier of the present invention.

Referring to FIG. 1, a highly schematic diagram of an amplifier circuit 2 and power supply circuit 4 designed in accordance with the present invention is illustrated. Electrical energy is supplied to the system by means of an oscillating power supply 6 which may take the form of a pulse generator or a source of commercially available current, such as convention 117-125 volt, 60 cycle alternating current. The primary coil 8 of a specially designed, lightweight transformer 10 is connected to the oscillating power supply 6 by means of a duty-cycle control circuit 12 designed to modulate the amount of energy supplied to the primary coil 8. The duty-cycle control circuit 12 is arranged so that pulses of lower power are transmitted to the primary coil for lower power requirements of the amplifier 2, and pulses of higher power are transmitted to the primary for higher power requirements of the amplifier. Within the broader aspects of the present invention, the duty-cycle control 12 can be made responsive to either or both of an audio input signal conductor 16 and a feedback line 18 connected with the audio amplifier 20.

The transformer secondary coil 22 is connected to a rectifier and amplifier power supply 24 designed to provide a direct current supply voltage to the amplifier 2. In the present embodiment, the amplifier has a relatively constant output voltage, and a voltage level feedback line 26 is employed to cause the duty-cycle control 12 to adjust the amount of power supplied to the primary coil 8 in order to assist in maintaining the output voltage from the amplifier power supply circuit 24.

The amplifier 2, which may be of the Class B push-pull type, includes at least a pair of output transistors 30 and 32 for amplifying the audio signals supplied on the line 16 to the respective base electrodes thereof. In the preferred embodiment, the amplifier 2 includes additional transistors 34 and 36, connected in series with transistors 30 and 32, respectively, to provide higher absolute supply voltage levels to the amplifier output 20 when necessary. When these higher voltages are unnecessary, the transistors 34 and 36 remain non-conductive as determined by the supply voltage control means 38 and 40 respectively. When the transistors 34 and 36 are non-conductive, voltage is supplied to the collectors of transistors 30 and 32 through diodes 42 and 44, respectively, which are in turn connected to lower voltage taps 46 and 48, respectively, of the amplifier power supply 24.

Figure 2:
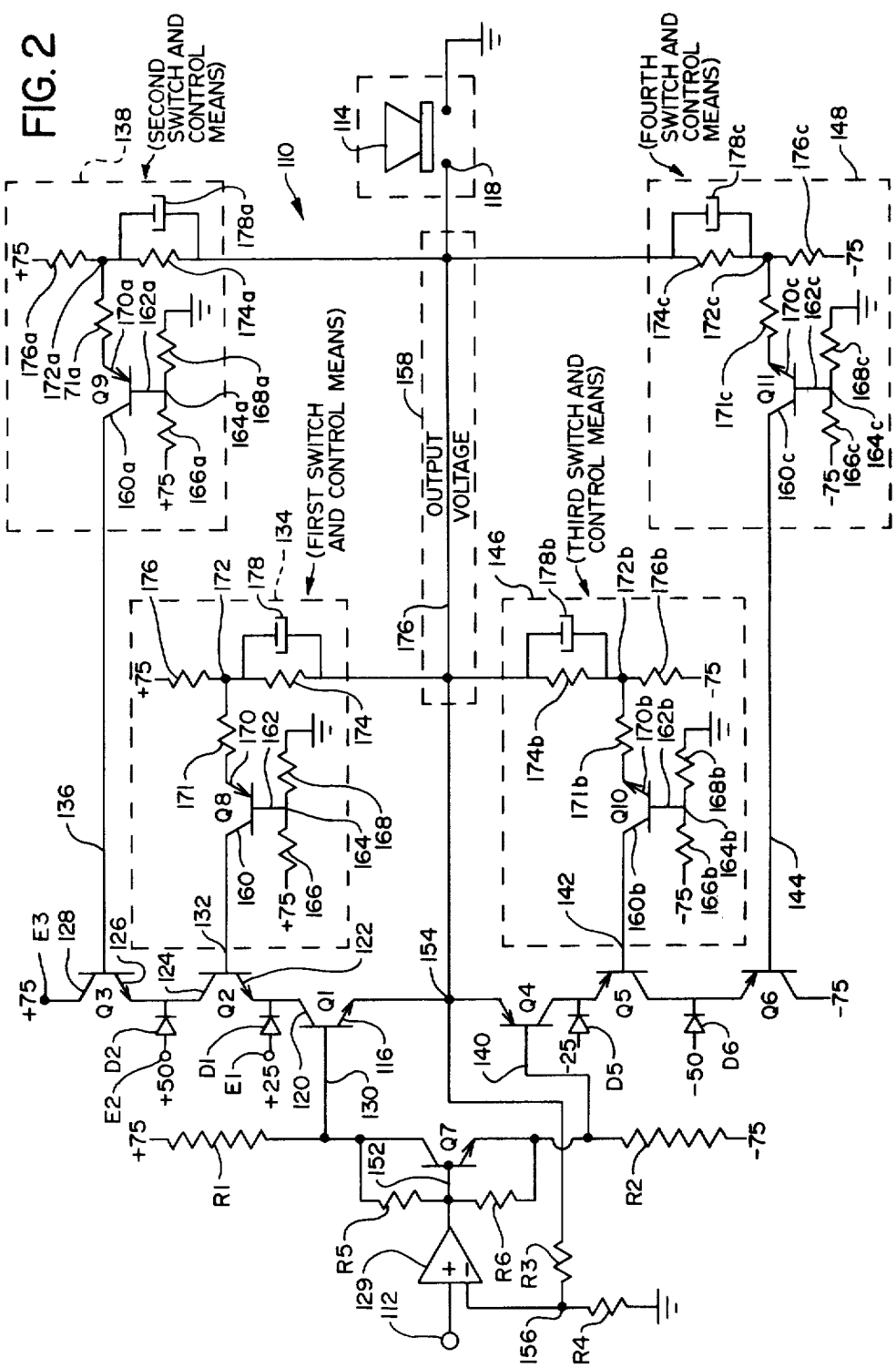
FIG. 2 is a more detailed circuit diagram of the amplifying portion of the present invention.

With reference to FIG. 2, there is shown in more detail an amplifying apparatus 110 suitable for use in the present invention. This amplifying apparatus is disclosed in a parent U.S. patent application Ser. No. 27,471, filed Apr. 5, 1979 now abandoned and PCT/U.S. No. 79/00952, filed Nov. 6, 1979, and it is disclosed in this application primarily to insure that the applicant is providing a full disclosure for practicing the present invention. However, it is to be understood that other of the amplifiers shown in these earlier patent applications, or other amplifiers that are in the prior art, could also be used with the present invention.

A signal voltage is provided at 112, and the output of the amplifier is connected through a load (shown herein as a speaker 114) to ground. There are two sets of transistors arranged in push-pull relationship, with each set being connected in series. The first set, Q1, Q2 and Q3 are NPN transistors, and these are used to amplify positive portions of the input signal. The other set of transistors, Q4, Q5 and Q6 are PNP transistors and are used to amplify negative portions of the input signal. In the following description, the overall operation of the first set of transistors, Q1, Q2 and Q3 will be described in detail, with the understanding that the same description would apply to the operation of Q4, Q5 and Q6 with respect to the negative portions of the signal.

It will be noted that the emitter electrode 116 of Q1 is connected to a power output terminal 118 of the load 114, and the collector electrode 120 is connected through a diode D1 to a DC voltage source E1 having a magnitude of plus 25 volts. The emitter electrode 122 of the second transistor Q2 is connected to the collector electrode 120, and the collector electrode 124 of the transistor Q2 is connected through a second diode D2 to an intermediate DC voltage source E2 having a magnitude of 50 volts. Finally, the third transistor Q3 has its emitter electrode 126 connected to the collector electrode 124, and its collector electrode 128 is connected directly to a higher DC voltage source E3, which is shown as having a magnitude of plus 75 volts.

As discussed previously herein, under the topic heading "Background of the Invention", various arrangements of series coupling of three transistors, with the stepped voltage sources of increasing magnitude are shown in the prior art. It is believed that a better understanding of the operating features of the amplifier used in this embodiment of the present invention will be achieved by preceding a detailed description of this amplifier with a general discussion of the general mode of operation of prior art devices using an arrangement of series connected transistors with stepped voltage sources.

To discuss generally the prior art modes of operation, when the signal voltage is relatively small (e.g., below 25 volts) only the first transistor Q1 would be conductive, and all of the power would be derived from the 25 volt power sources E1. The obvious advantage is that there is less voltage drop across the transistor Q1, and thus an increase in efficiency.

When the signal voltage approaches very close to the value of the first voltage level, in prior art devices the signal output is then applied in some manner to the base of the transistor Q2 to make it conductive, so that the power is derived from the 50 volt source E2, with the 25 volt source being blocked out by the diode D1. While the signal is fluctuating between the 25 volt and 50 volt level, substantially all or at least the major portion of, the voltage drop is taken across the second transistor Q2.

In like manner, when the signal voltage rises above the 50 volt level, the voltage signal is applied to the base of the transistor Q3 to make it conductive and thus derive power from the 75 volt power source E3. Also, with the signal voltage fluctuating between the 50 and 75 volt level, substantially all, or at least the major portion of, the voltage drop is taken across the third transistor Q3. Thus, with regard to the prior art devices, each of the transistors must be made with the capability of withstanding the voltage drop imposed across that transistor at the current levels existing at the various voltage levels.

To insure that there is no confusion, it bears repeating that the description in the immediately preceding three paragraphs, relative to the operation of transistors Q1, Q2 and Q3, does not relate to the amplifier described in the present invention, but to the general mode of operation of prior art devices. In the paragraph immediately following, the operating characteristics of the amplifier used in the present invention will be described.

Reference is again made to FIG. 2. To discuss specifically the amplifier used in the present invention, it will be noted that the signal input terminal 112 is connected through an operational amplifier 129 to a biasing transistor Q7 through a resistor R1 to a plus 75 volt source. The base electrode 130 of the transistor Q1 is connected at a junction point between the resistor R1 and transistor Q7 to provide a forward bias to the transistor Q1. The base electrode 132 of the second transistor Q2 is connected to a first switch and control means, indicated at 134, and the base electrode 136 of the third transistor Q3 is connected to a second switch and control means, indicated at 138.

The second set of transistors Q4, Q5 and Q6 are similarly connected. Thus, there is the biasing transistor Q7 connected in series with a resistor R2 to a minus 75 volt source, with the base electrode 140 of transistor Q4 connected to a terminal between the transistor Q7 and resistor R2. The base electrodes 142 and 144 of, respectively, transistors Q5 and Q6 are connected to, respectively, a third switch and control means 146 and a fourth switch and control means 148. Stepped voltage sources E4, E5 and E6 are provided in the same manner as the sources E1, E2 and E3, respectively.

As shown herein, the input 112 is through an operational amplifier 129 to the base 152 of biasing transistor Q7. There is a feedback from the output junction 154 between the transistors Q1 and Q4 back through the resistors R3 and R4 to ground. From the junction 156 intermediate the transistors R3 and R4, there is a feedback connection back to the operational amplifier 152. The resistors R5 and R6 are to provide an intial biasing voltage to the transistors Q1 and Q4, respectively.

Figure 3:
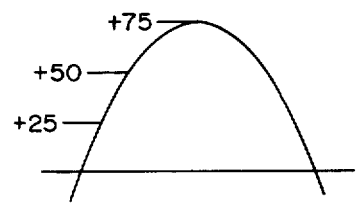
FIG. 3 is a representation of a portion of a signal voltge amplified by the present invention.

The general function of each of the switch and control means 134, 138, 146 and 148, is to cause its related transistor to become conductive at the appropriate time and then to control the voltage drop across its related transistor in such a manner as to portion the voltage drop across the transistors then conducting so as to minimize the power which must be dissipated by any transistor at any particular time. The manner in which this is accomplished can best be described with reference to the graphs of FIGS. 4a, 4b and 4c, and also with reference to the signal voltage illustrated in FIG. 3.

Figure 4A:
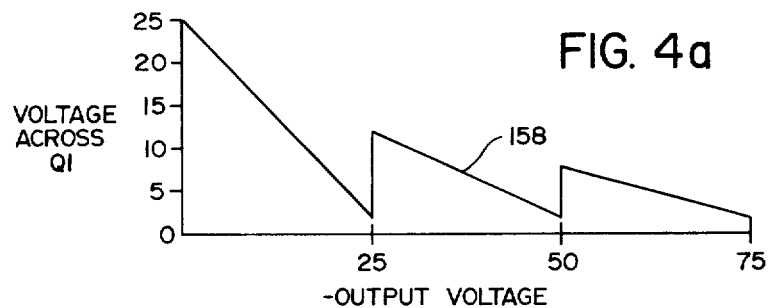
FIGS. 4a, 4b and 4c are graphs illustrating certain operating characteristics of the amplifier used in the present invention, where the voltage drop across a single set of transistors is plotted against the signal voltage and/or the output voltage.

In FIG. 4a, the voltage drop across the first transistor Q1 is plotted against the output voltage. Let it be assumed that the signal voltage has climbed to a low level of five volts. This voltage is applied to the transistor Q1 to cause it to become conductive to transmit current from the plus 25 volt source E1 through the transistor Q1 and to the output terminal 118. Thus, the voltage at the output terminal 118 will be approximately 5 volts, and the voltage drop across the transistor Q1 would be approximately 20 volts. As the signal current increases to a value closer to the 25 volt level, the voltage level at the output terminal 118 increases, while the voltage drop across the transistor Q1 decreases.

Figure 4B:
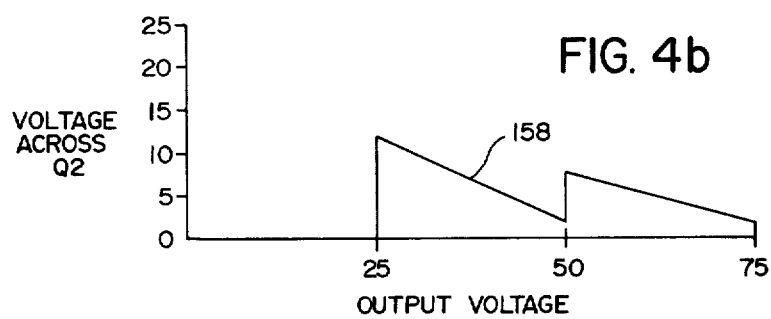

When the signal voltage comes within one or two volts of the 25 volt level, the first switch and control means 134 becomes operative and directs current to the base electrode 132 at a voltage level intermediate the level of the output voltage, indicated schematically by the numeral 158, and the value of the plus fifty voltage source E2. The graphs of FIG. 4a and 4b illustrated this relationship in a somewhat idealized manner, where the first switch and control means 134 functions to apply a voltage to the base electrode 132 that is consistently midway between the output voltage and the plus 50 volt level at E2, so that the voltage drop across the two transistors Q1 and Q2 remain substantially equal for all output voltages between 24 and 50 volts. In the actual embodiment shown herein, the apportioning of the voltage drop across transistors Q1 and Q2 would depart moderately from this idealized situation.

When the signal voltage comes very close to the 50 volt level, then the second switch and control means 138 makes the third transistor Q3 become conductive and also transmits base current to the base electrode 136 at a sufficiently high voltage so that only a portion of the total voltage drop is across the transistor Q3. In like manner, the first switch and control means 134 continues to supply current to the base electrode 132 of the transistor Q2 so that the voltage drop across Q2 is within its apportioned share of the total voltage drop across the three transistors Q3, Q2 and Q1.

Figure 4C:
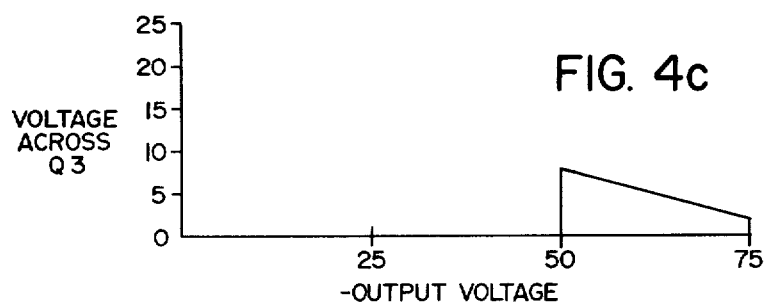

Again, the somewhat idealized situation is shown in FIGS. 4a, 4b and 4c, in that with the output voltage between 50 and 75 volts, the voltage drop is equally apportioned among all three transistors. In actual practice, the apportioning would not be that precise. The manner in which the four switch and control means 134, 138, 146 and 148 operate will now be described. Since each of the four switch and control means, 134, 138, 146 and 148 are substantially identical with one another, only the first means 134 will be described in detail herein.

In the first switch and control means 134, there is a control transistor Q8 having its collector electrode 160 connected to the base electrode 132 of the second power transistor Q2. The base electrode 162 of the transistor Q8 is attached to a junction point 164 between two voltage dividing resistors 166 and 168. the other end of the resistor 166 is connected to a plus 75 volt terminal, while the other end of the resistor 168 is connected to ground.

The emitter electrode 170 of the transistor Q7 is connected through a resistor 171 to a juncture point 172 between two voltage dividing resistors 174 and 176. The other end of the resistor 176 is connected to a plus 75 volt source, while the other end of the resistor 174 is connected to the main output line 176 leading to the output terminal 118. A capacitor 178 is connected in parallel with the resistor 174 to alleviate rapid voltage changes across the resistors 174 and 176.

To describe the operation of the first switch and control means 134, as discussed previously herein, it is desired that the transistor Q2 should become conductive when the signal voltage (and consequently the output voltage which should be substantialy identical to the signal voltage) comes to a level just below the 25 volt level. In accordance with the previous discussion of the operation of this circuitry, it is also desired that the current supplied to the base electrode 132 of the transistor Q2 be at a level approximately intermediate the output voltage and the next stepped voltage in the power source, which is the 50 volt power source E2. Accordingly, when the output voltage reaches approximately the 25 volt level, it is desired that the base electrode 132 of the transistor Q2 have a current delivered thereto at a voltage approximately midway between 25 to 50 volts (e.g., approximately 37½ volts).

Thus, the value of the resistances 166 and 168 are selected so that when little or no base current is flowing to the base electrode 162 of the transistor Q8 the voltage at the junction point 164 is approximately 37.5 volts. The values of the two resistors 174 and 176 are so selected that when the output voltage comes within one or two volts of the voltage of the lowest power terminal (.i.e., 25 volts) the voltage at the junction 172 is approximately 38.2 volts so as to apply a forward bias to the emitter electrode 170 of the transistor Q7 to cause the transistor Q7 to become conductive and transmit base current to the base electrode 132 of the transistor Q2. Since the emitter electrode 122 of the transistor Q2 tends to follow the voltage of the base electrode 132 within a fraction of a volt, the immediate effect would be to bring the voltage at the emitter electrode 122 to approximately 37.5 volts. Thus, with the output voltage being at approximately 25 volts, the voltage drop across the transistor Q2 would be approximately 12.5 volts, and the voltage drop across Q1 would be 12.5 volts, thereby causing the power dissipated to be shared equally by Q1 and Q2.

As the signal voltage increases in the 25 volt to 50 volt range, the voltage at the junction point 172 likewise increases so as to tend to drive the voltage at the emitter electrode 170 upwardly. This causes an increase of base current to the base electrode 162, thus causing a greater current flow through the resistor 168 and into the base electrode 162. The effect of this is to raise the voltage of the junction point 164 to a level closer to the voltage of the emitter electrode 170, and also cause the transistor Q8 to be more conductive so that greater current is supplied to the base current 132 at a yet higher voltage. The effect of this is to raise the voltage at the emitter electrode 122 of the transistor Q2 yet higher (i.e., closer to the 50 volt level). Thus, as the output voltage increases from the 25 volt level toward the 50 volt level, the voltage drop across the transistor Q2 is likewise diminishes so that there is an apportionment of the voltage drop between the transistors Q2 and Q1.

By the time the signal voltage reaches the second power source increment level (i.e., the 50 volt level), substantially all of the voltage drop is across the load, and there is very little voltage drop across the two transistors Q1 and Q2. At this time, the second switch and control means 138 becomes operative to cause the third transistor Q3 to become conductive. Since this is accomplished in substantially the same manner as in the operation of the first switch and control means 134, the operation of the means 138 will be summarized only briefly.

It can be seen that there is a control transistor Q9 having a collector electrode 160a connected to the base electrode 136 of the transistor Q3. There are a pair of voltage dividing resistors 166a and 168a producing a voltage level of approximately 62.5 volts at the juncture point 164a. Also, the two voltage dividing resistors 174a and 176a are so arranged that when the output voltage reaches a level just below the 50 volt level, the voltage at the junction point 172 is approximately 63.2 volts.

Thus, when the output voltage comes quite close to the 50 volt level, a forward bias is applied between the emitter electrode 170a and the base electrode 162a to cause the transistor Q9 to become conductive to supply base current to the base electrode 136 and thus cause transistor Q3 to conduct. As soon as the transistor Q3 becomes conductive, the voltage of the emitter electrode 126 of the transistor Q3 tends to rise a level close to that of the base electrode 136 (i.e., approximately 63.2 volts). This causes the diode D2 to block off the 50 volt power source so that all of the power is derived from the plus 75 volt power source.

At the time that the output voltage is slightly above 50 volts, the voltage at which current is being delivered through the transistor Q8 to the base electrode 132 of the transistor Q2 is at an intermediate level between the output voltage and the voltage of the current to the base electrode 136 of the transistor Q3. Thus, the voltage drop from the 75 volt source to the level just above the 50 volts being delivered to the output terminal 18 is apportioned between the three transistors Q3, Q2 and Q1. As the output voltage increases further toward the 75 volt level, the voltages at the junction points 172 and 172a increase proportionately to raise the voltage of the currents delivered to the base electrodes 132 and 136, and thus increase the voltage level at the emitter electrodes 122 and 126 of the transistors Q2 and Q3. Thus, the voltage drop across the three transistors Q1, and Q2 and Q3 continues to be apportioned between the three transistors. As indicated previously, the apportioning illustrated in the graphs of FIGS. 4a, 4b and 4c is somewhat idealized, and the actual voltage drops will depart somewhat from the precisely equal apportionment. The operation of the third and fourth switch and control means 146 and 148 is substantially the same as that of the first and second switch control means 134 and 138, respectively, except that the means 146 and 148 operate on the negative portions of the input signal. Accordingly, the operation of the means 146 and 148 will not be described in detail herein. Instead like numerical designations have been given to the components of the means 146 and 148, with a "b" suffix distinguishing those of the means 146, and a "c" suffix distinguishing those of the means 148. The control transistor of the means 146 is designated Q10, while the control transistor of the means 148 is designated Q11.

The control transistors Q10 and Q11 operate in substantially the same manner as corresponding transistors Q8 and Q9 to make the power transistors Q5 and Q6, respectively, conductive at the proper negative voltage levels, and also control the voltage level of the emitter electrodes of the transistors Q5 and Q6 to apportion the voltage drop across the three transistors Q4, Q5 and Q6. As indicated above, since this is apparent from the above description with reference to the first and second switch and control means 134 and 138, the description will not be repeated with reference to the means 46 and 48.

As indicated earlier, the amplifier described above is presented as one amplifier suitable for use in the present invention and other amplifiers, such as those described in the parent applications noted above or possibly some prior art amplifiers of others, could also be used.

Figure 5:
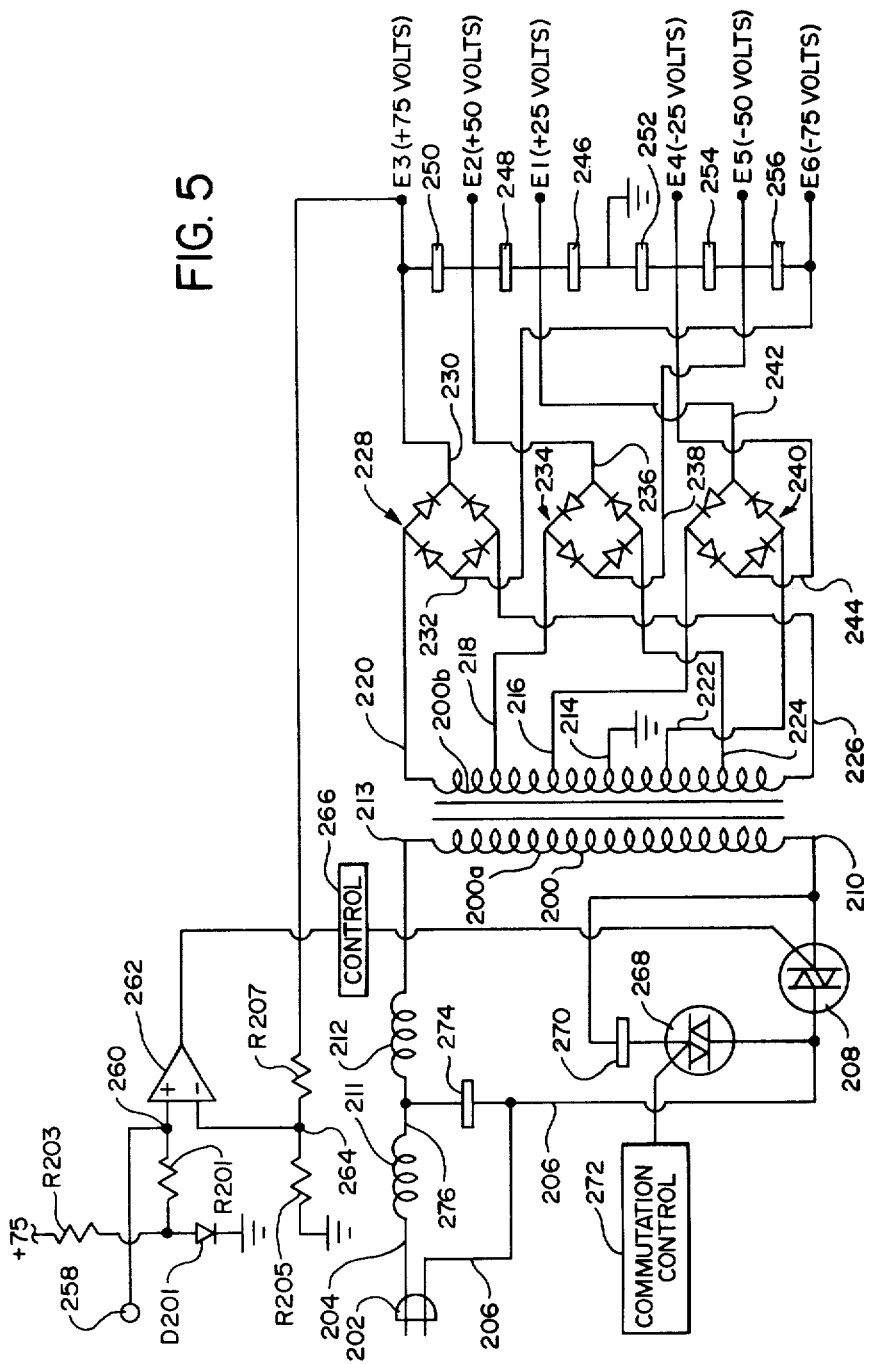
FIG. 5 is a circuit diagram of the power supply apparatus of the present invention.

FIG. 5 illustrates a stepped voltage power supply constructed in accordance with the present invention. There is a power source such as a wall plug 202 including two leads 204 and 206. The lead 206 is connected to a triac 208, and the opposite side of the triac 208 connects to the lower end 210 of a primary winding 200a of a transformer 200. The other lead 204 of the power source 202 is connected through two inductance coils 211 and 212, which are in series with one another, to an upper end 213 of the primary winding 200a. The secondary winding 200b of the transformer 200 is tapped to ground at its center point 214.

The secondary winding 200b of transformer 200 is tapped to ground at its center point 214. The upper half of secondary winding 200b is tapped at two intermediate locations 216 and 218 to provide the positive 25 volt and 50 volt outputs for the power terminal E1 and E2. A connection 220 to the upper end of winding 200b provides the positive 75 volt output for power terminal E3. In like manner, the bottom half of the secondary winding is tapped at three equally spaced location, 222, 224 and 226 to respectively provide the negative 25, 50 and 75 volt outputs E4, E5 and E6.

The positive and negative 75 volt leads 220 and 226 are attached at opposite ends to a first bridge rectifier, generally indicated at 228. The positive output of bridge rectifier 228 is connected by lead 230 to the positive 75 volt power terminal E3, and the negative output of the bridge rectifier 228 is connected to the negative 75 volt power output E6 through lead 232. The positive and negative 50 volt leads 218 and 224 are connected to the opposite ends of a second bridge rectifier 234. The positive output terminal of bridge rectifier 234 is connected by lead 236 to the positive 50 volt power terminal E2, while the negative output from the bridge rectifier 234 is connected through lead 238 to the negative 50 volt power terminal E5. Finally, the positive and negative 25 volt leads 216 and 222 are connected to opposite ends of a third bridge rectifier 240. The output leads 242 and 244 of bridge rectifier 240 are respectively attached to the positive and negative 25 volt power terminal E1 and E4.

Six capacitors, designated 246 through 256, are provided betweem the power output terminals E1 through E6 to compensate for any abrupt power demand on the related output terminal so as to maintain the output voltage terminals at nearly constant voltage level.

The triac 208 is controlled by an audio input signal as will be explained more fully hereinbelow. The audio input signal is directed into an input terminal 258 and thence to a junction point 260. The resistors R201 and R203 are connected between junction 260 and a suitable voltage source (e.g., a 75 volt source) to provide a base voltage level of, for example, 0.7 volts. This voltage is developed by diode D201 connected from the junction of R203 and R201 to ground. The voltage is in turn directed to an operational amplifier 262. Feedback to the operational amplifier is obtained from the voltage source E3 in the transformer secondary circuit, which is connected through two voltage dividing resistors R205 and R207 to ground. At a junction point 264 between the two resistors R205 and R207 there is a feedback connection to the operational amplifier 262. The output of operational amplifier 262 is directed to a suitable control apparatus indicated at 266. This control apparatus 266 is connected to the control terminal of the triac 208 in a manner such that at higher output levels from operational amplifier 262, the triac 208 is caused to conduct at greater voltage levels on the latter portion of each half cycle. In like manner, when the output of the operational amplifier 262 is lower, the triac 208 is caused to fire at voltage levels nearer to zero.

There is a second triac 268 connected in parallel with the triac 208. A capacitor 270 is connected in series with the triac 268 and acts to periodically shunt the triac 208. Operation of the triac 268 is controlled by a commutation control, indicated schematically at 272.

A capacitor 274 is connected between a junction point 276 of the two inductance coils 211 and 212 and to the line 206 that leads to the triac 208. As will be described more fully hereinafter, the capacitor 274 and the coil 212 make a tank circuit which causes desired oscillations in current passing through the primary winding 200a.

Figure 6A:
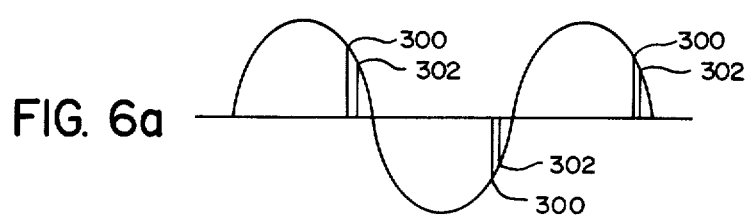
FIGS. 6a, 6b and 6c are graphs illustrating the switching of the current to the power transformer of the present invention.
Figure 6B:
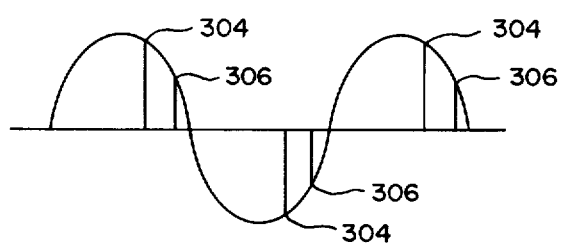
Figure 6C:
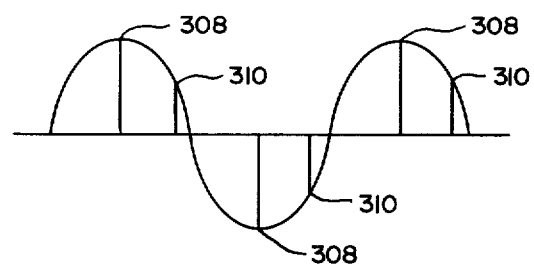

To describe the operation of the present invention, reference is made to FIGS. 6A, 6B and 6C. The voltage source 202 is an alternating current, and the triac 208 is caused to conduct in the latter half of each half cycle, whether it be a positive or negative half cycle. When the power requirements of the amplifier are low, the control apparatus 262 acts to cause the triac 208 to conduct at a later time during each half cycle, as illustrated in FIG. 6A, where the point of conduction of each half cycle is illustrated at 300. The triac 208 remains conductive until the voltage reaches a predetermined lower point, illustrated in FIG. 6A at 302. The manner in which the triac 208 is caused to be non-conductive at point 302 is particularly significant in the present invention, and that will be described later herein.

As the requirements of the amplifier become greater, due to greater amplitude in the control signal, the triac 208 is caused to conduct at a higher voltage level for the latter part of each half cycle, as illustrated in FIG. 6B, where the point of conduction is indicated at 304, and each cut-off point is indicated at 306. It can be seen that not only is the voltage higher, but also the time increment of each current pulse is longer, so that greater power is delivered to the primary winding 200a. Finally, in FIG. 6C, there is shown a situation where the input signal is at a maximum and the power requirements of the amplifier are accordingly at a maximum. In this situation, the triac 208c is caused to conduct near the peak voltage at the beginning of the latter half of each half cycle, as illustrated at 308, with the cut-off point being indicated at 310.

Current flows in the secondary winding 200b simultaneously with the flow of current in the primary winding 200a, with the current in 200b also being an alternating current. With regard to the flow of current through the two 75 volt leads 220 and 226, since this current flows through the rectifying bridge 228, the output to the power terminal E3 is always positive, while the output to the terminal E6 is always negative. In like manner, current is directed from the intermediate terminals 216, 218, 222 and 224 through the two bridge rectifiers 234 and 240 to provide positive current to the output terminals E2 and E1 at the positive 50 and 25 volt levels, and to provide negative current to the power terminals E5 and E4 at the negative 50 and 25 volt levels, respectively.

To describe the manner in which the triac 208 is turned off during the latter part of the last half of each half cycle, first, it should be understood that once the triac 208 is made conductive, it will remain in a conductive condition until the current through the triac 208 drops to zero, after which the triac 208 will automatically shut itself off. Thus, to turn the triac 208 off, the second triac 268 is made conductive at a predetermined time to divert current from the triac 208 and cause the current through the primary winding 200a to begin to flow through the capacitor 270. Current continues to flow through the primary winding 200a and through the triac 268 until the voltage build-up in the capacitor 270 reaches a level sufficient to turn the triac 268 off, thus ending current flow through the transformer primary 200a.

However, prior to the present invention, one of the problems in effectively diverting the current even for a ver short period of time to the capacitor 270, is that the capacitor 270 must be made inordinately large. Thus, in the present invention, there is provided the tank circuit, made up of the coil 212 and capacitor 274 to cause oscillations in the current through the primary winding 200a. The triac 268 is turned on during a low point of such oscillations where relatively little current needs to be diverted through the capacitor 270. To explain this more fully, let it be assumed that the sine wave from power source 202 has diminished such that the rectifying bridges 228, 234 and 240 have switched off at time A. At time A, the tank circuit made up of the inductance oil 212 and capacitor 274 begins to oscillate. After one-half cycle of oscillation, current through the transformer primary 200a and the triac 208 has reached a minimum value due to collapse of the sustaining magnetic field. This instant of time will be called "time B". At time B, when current is at a minimum, the triac 268 is fired by the commutation control 272. Thus the current which would have flown through triac 208 is diverted through the capacitor 270 for several microseconds, thus commutating the triac 208 off. Shortly after that, the capacitor 270 assumes a full charge, and the current through the primary winding 200a thus drops to zero. On successive negative half cycles the mode of operation is substantially the same.

To discuss the significance of the present invention, attention is directed again to FIGS. 6A through 6C. During each half-cycle, until the triac 208 turns on, no current is flowing through the primary winding 200a. If no provision were made for turning the triac 208 off, it would remain conductive until the sine wave would reach the zero level, at which time the triac 208 would automatically shut itself off. For low power requirements, such as illustrated in FIG. 6A, shutting off the triac 208 is not critical since the total time increment during which current is flowing through the primary winding 200a is not large. However, during periods of higher power requirements, such as the circumstance illustrated in FIG. 6C, the time increment during which the primary winding is conducting is considerably longer, and thus in the latter part of each half-cyle, there is a tendency for the core of the transformer to saturate and cause a current spike to occur in the primary winding. This current spike is wasted energy which is dissipated as heat in the transformer. Thus, by effectively shutting off the current in latter part of the last half of each half-cycle, this current spike is eliminated, and the transformer can operated with much higher efficiency.

What is claimed is:

1. An amplifying apparatus comprising:
  a. power input terminal means adapted to be connected to a source of current,
  b. a transformer with primary and secondary windings, said primary winding being connected to said power input means,
  c. first switch means interconnected with said primary winding and said power input terminal means to cause current pulses from said power input terminal means to said primary winding,
  d. circuit bypass means connected in parallel with said first switch means, said circuit bypass means comprising second switch means and capacitor means connected in series with one another,
  e. an oscillating circuit means operatively connected to said first switch means to cause an oscillation in current pulses flowing through said first switch means,
  f. amplifying means operatively connected to the secondary winding of the transformer so as to draw current therefrom,
  g. control means operatively connected to the first and second switch means in a manner to cause the first switch means to become conductive at successive periods of time to initiate successive current pulses through said first switch means and through said primary winding, and subsequently to cause said second switch means to be conductive at a time of lower current magnitude of oscillation in said current pulses to cause current through the primary winding to flow through the current bypass means and to cause said first switch means to be non-conductive, said control means causing said first switch means to be conductive in a manner to provide lower power pulses for lower power requirements of the amplifying means, and to become conductive in a manner to provide higher power pulses for higher power requirements of the amplifying means.

2. The apparatus as recited in claim 1, wherein said first switch means comprises a triac which conducts pulses of alternating current through said primary winding.

3. The apparatus as recited in claim 1, wherein said first switch means comprises a triac which conducts both negative and positive pulses of alternating current through said primary winding, and said second switch means comprises a second triac which bypasses current through said primary winding for both negative and positive pulses of alternating current.

4. The apparatus as recited in claim 1, wherein said oscillating circuit means comprises a tank circuit connected across said first switch means.

5. The apparatus as recited in claim 1, wherein
  a. said first switch means comprises a triac which conducts both negative and positive pulses of alternating current through said primary winding, and said second switch means comprises a second triac which bypasses current through said primary winding for both negative and positive pulses of alternating current,
  b. said oscillating circuit means comprises an inductance coil means and a capacitor means connected in series with one another and across said first switch means and the primary winding,
  c. there is other coil conductance means connected at one end between said inductance coil means and said capacitor means of the oscillating circuit means, and by another end to said power input terminal.

6. The apparatus as recited in claim 1, wherein
  a. said first switch means comprises a triac which conducts both negative and positive pulses of alternating current through said primary winding, and said second switch means comprises a second triac which bypasses current through said primary winding for both negative and positive pulses of alternating current, b. said oscillating circuit means comprises an inductance coil means and a capacitor means connected in series with one another and across said first switch means and the primary winding, c. there is other coil conductance means connected at one end between said inductance coil means and said capacitor means of the oscillating circuit means, and by another end to said power input terminal means.

7. The apparatus as recited in claim 1, wherein said oscillating circuit means comprises an inductance coil means and a capacitor means connected in series with one another and across said first switch means and the primary winding.

8. The apparatus as recited in claim 7, further comprising other coil inductance means connected at one end between said inductance coil means and said capacitor means of the oscillating circuit means, and by another end to said power input terminal means.

9. The apparatus as recited in claim 8, wherein said control means is arranged to cause said first switch means to be conductive during latter portions of each half cycle in a manner that for lower power requirements said first switch means becomes conductive at a lower voltage level of each half cycle, and for higher power requirements said first switch means is caused to be conductive at a higher voltage level of each half cycle.

10. An apparatus adapted to supply power to an amplifier or the like, comprising:

a. power input terminal means adapted to be connected to a source of current, b. a transformer with primary and secondary windings, said primary winding being connected to said power input means, c. first switch means interconnected with said primary winding and said power input terminal means to cause current pulses from said power input terminal means to said primary winding, d. circuit bypass means connected in parallel with said first switch means, said circuit bypass means comprising second switch means and capacitor means connected in series with one another, e. an oscillating circuit means operatively connected to said first switch means to cause an oscillation in current pulses flowing through said first switch means, f. control means operatively connected to the first and second switch means in a manner to cause the first switch means to become conductive at successive periods of time to initiate successive current pulses through said first switch means and through said primary winding, and subsequently to cause said second switch means to be conductive at a time of lower current magnitude of oscillation in said current pulses to cause current through the primary winding to flow through the current bypass means and to cause said first switch means to be non-conductive, said control means causing said first switch means to be conductive in a manner to provide lower power pulses for lower power requirements, and to be conductive to provide higher power pulses for higher power requirements.

11. The apparatus as recited in claim 10, wherein said first switch means comprises a triac which conducts pulses of alternating current through said primary winding.

12. The apparatus as recited in claim 10, wherein said first switch means comprises a triac which conducts both negative and positive pulses of alternating current through said primary winding, and said second switch means comprises a second triac which bypasses current through said primary winding for both negative and positive pulses of alternating current.

13. The apparatus as recited in claim 10, wherein said oscillating circuit means comprises a tank circuit connected across said first switch means.

14. The apparatus as recited in claim 10, wherein said oscillating circuit means comprises an inductance coil means and a capacitor means connected in series with one another and across said first switch means and the primary winding.

15. The apparatus as recited in claim 10, wherein a. said first switch means comprises a triac which conducts both negative and positive pulses of alternating current through said primary winding, and said second switch means comprises a second triac which bypasses current through said primary winding for both negative and positive pulses of alternating current, b. said oscillating circuit means comprises an inductance coil means and a capacitor means connected in series with one another and across said first switch means and the primary winding, c. there is other coil conductance means connected at one end between said inductance coil means and said capacitor means of the circuit bypass means, and by another end to said power input terminal means.

16. The apparatus as recited in claim 14, further comprising other coil inductance means connected at one end between said inductance coil means and said capacitor means of the oscillating circuit means, and by another end to power input terminal means.

17. An amplifying apparatus comprising:

a. power input terminal means adapted to be connected to a source alternating current, b. a transformer with primary and secondary windings, said primary winding being connected to said power input means, c. first switch means interconnected with said primary winding and said power input terminal means to become conductive for both positive and negative half cycles from said power input terminal means to said primary winding, d. circuit bypass means connected in parallel with said first switch means, said circuit bypass means comprising second switch means and capacitor means connected in series with one another, e. an oscillating circuit means operatively connected to said first switch means to cause an oscillation in current pulses flowing through said first switch means, f. amplifying means operatively connected to the secondary winding of the transformer so as to draw current therefrom for generally constant voltage sources, g. control means operatively connected to the first and second switch means in a manner to cause the first switch means to become conductive during latter portions of each half cycle to initiate successive current pulses through said first switch means and through said primary winding, and subsequently to cause said second switch means to be conductive at a time of lower current magnitude of oscillation in said pulses to cause current through the primary winding to flow through the current bypass means and to cause said first switch means to be non-conductive, said control means causing said first switch means to be conductive at lower voltage levels of half cycles to provide lower power pulses for lower power requirements of the amplifying means, and to be conductive at higher voltage levels of half cycles to provide higher power pulses for higher power requirements of the amplifying means.

18. The apparatus as recited in claim 17, wherein said first switch means comprises a triac which conducts pulses of alternating current through said primary winding.

19. The apparatus as recited in claim 17, wherein said first switch means comprises a triac which conducts both negative and positive pulses of alternating current through said primary winding, and said second switch means comprises a second triac which bypasses current through said primary winding for both negative and positive pulses of alternating current.

20. The apparatus as recitedin claim 17, wherein said oscillating circuit means comprises a tank circuit connected across said first switch means.

21. The apparatus as recited in claim 17, wherein said oscillating circuit means comprises an inductance coil means and a capacitor means connected in series with one another and across said first switch means and the primary winding.

22. The apparatus as recited in claim 21, further comprising other coil inductance means connected at one end between said inductance coil means and said capacitor means of the circuit bypass means, and by another end to said power input terminal means.

23. A method of providing power for an audio amplifier or the like, said method comprising:
  a. providing power input terminal means adapted to be connected to a source of current and a transformer with primary and secondary windings,
  b. causing a first switch means interconnected with said primary winding and said power input terminal means to become conductive at periodic time intervals to initiate current pulses from said power input terminal means to the primary winding,
  c. causing an oscillation in at least latter portions of said current pulses,
  d. causing circuit bypass means connected in parallel with said first switch means to be conductive at a time of lower current magnitude of oscillation in said current pulses to cause current through the primary winding to flow through the current bypass means, and causing said first switch means to be non-conductive, then blocking current through said circuit bypass means to stop current flow through said primary winding so as to terminate each current pulse,
  e. controlling conductivity of said first switch means and said circuit bypass means to provide lower power pulses for lower power requirements, and to provide higher power pulses for higher power requirements.

24. The method as recited in claim 23, further comprising directing current through said circuit bypass means to a capacitor which becomes charged to block further current through said circuit bypass means.

25. The method as recited in claim 23, wherein said first switch means comprises a triac which conducts pulses of alternating current through said primary winding, said method further comprising shutting off said triac by bypassing substantially all of the current through the primary winding to the circuit bypass means.

26. The method as recited in claim 23 wherein said first switch means comprises a triac which conducts both negative and positive pulses of alternating current through said primary winding, and said second switch means comprises a second triac which bypasses current through said primary winding for both negative and positive pulses of alternating current.

27. The method as recited in claim 23, wherein said oscillating circuit means comprises a tank circuit connected across said first switch means.

28. The method as recited in claim 23, wherein said oscillating circuit means comprises an inductance coil means and a capacitor means connected in series with one another and across said first switch means and said primary winding.

29. The method as recited in claim 23, wherein said oscillations are blocked from said power source by inductance coil means connected between said oscillating circuit means and said power source.

* * * * *